United States Patent [19]
Tanaka

[11] Patent Number: 5,986,300
[45] Date of Patent: *Nov. 16, 1999

[54] SEMICONDUCTOR MEMORY DEVICE AND METHOD OF MANUFACTURING THE SAME

[75] Inventor: Yoshinori Tanaka, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/661,580

[22] Filed: Jun. 11, 1996

[30] Foreign Application Priority Data

Jun. 27, 1996 [JP] Japan ................................ 7-161040

[51] Int. Cl.$^6$ .......................... H01L 27/108; H01L 29/76; H01L 29/94
[52] U.S. Cl. ........................... 257/306; 257/309; 257/296
[58] Field of Search ................... 257/296–310, 257/311; 438/254–260, 396–399, 243–253

[56] References Cited

U.S. PATENT DOCUMENTS

| | | |
|---|---|---|
| 4,673,962 | 6/1987 | Chatterjee et al. ..................... 257/304 |
| 5,023,683 | 6/1991 | Yamada . |
| 5,155,057 | 10/1992 | Dennison et al. ..................... 438/254 |
| 5,166,090 | 11/1992 | Kim et al. . |
| 5,223,448 | 6/1993 | Su ........................................... 438/397 |
| 5,247,196 | 9/1993 | Kimura ................................... 257/306 |
| 5,284,787 | 2/1994 | Ahn ........................................ 438/396 |
| 5,346,844 | 9/1994 | Cho et al. .............................. 438/253 |
| 5,532,956 | 7/1996 | Watanabe ............................... 257/306 |
| 5,629,540 | 5/1997 | Roh et al. .............................. 257/306 |
| 5,661,065 | 8/1997 | Koga ...................................... 438/253 |

FOREIGN PATENT DOCUMENTS

| | | |
|---|---|---|
| 4109299 | 10/1991 | Germany . |
| 4232817 | 4/1993 | Germany . |
| 62-286270 | 12/1987 | Japan . |
| 1-257365 | 10/1989 | Japan . |
| 2-219264 | 8/1990 | Japan . |
| 6-196649 | 7/1994 | Japan . |
| 92-18951 | 10/1992 | Rep. of Korea . |
| 93-9087 | 5/1993 | Rep. of Korea . |

OTHER PUBLICATIONS

Novel Stacked Capacitor Cell for 64Mb DRAM by Wakamiya et al., VL Sympo., 1989, pp. 69–70.
"3–Dimensional Stacked Capacitor Cell for 16M and 64M DRAMS" by ENA et al., 1988 IEEE, pp. 592–595.

*Primary Examiner*—Minh Loan Tran
*Assistant Examiner*—Cuong Quang Nguyen
*Attorney, Agent, or Firm*—McDermott, Will & Emery

[57] ABSTRACT

A lower electrode of a capacitor is provided on a semiconductor substrate. The lower electrode includes an axis portion and a horizontal portion. An upper electrode of the capacitor is provided above the semiconductor substrate to cover the outer surface of the axis portion and the outer surface of the horizontal portion.

12 Claims, 11 Drawing Sheets

SEMICONDUCTOR MEMORY DEVICE AND METHOD OF MANUFACTURING THE SAME

BACKGROUND OF THE INVENTION

1. Field of the Invention

The present invention generally relates to a semiconductor memory device, and more particularly to a semiconductor memory device which is improved so that effective capacitance of a capacitor can be increased without enlarging the cell area of a memory cell.

The present invention also relates to a method of manufacturing such a semiconductor memory device. Moreover, the present invention relates to a method of manufacturing a semiconductor memory device which is improved so that damage to a cylindrical capacitor can be prevented upon megasonic cleaning or the like.

2. Description of the Background Art

FIGS. 28 to 30 are cross sectional views of a semiconductor memory device in the order of the steps performed in a manufacturing process of the semiconductor memory device according to a first conventional example disclosed in Japanese Patent Laying-Open No. 6-196649.

Referring to FIG. 28, an interlayer insulating film 2 is formed on a semiconductor substrate 1. A silicon oxide film 3 formed by CVD (Chemical Vapor Deposition) to which no impurity is added is formed on interlayer insulating film 2. A contact hole 100 is formed in interlayer insulating film 2 and silicon oxide film 3, penetrating these films to expose a portion of the surface of semiconductor substrate 1. A lower electrode 4 of a capacitor made of phosphorous doped polycrystalline silicon film is formed to be in connection with the surface of semiconductor substrate 1 through contact hole 100. Lower electrode 4 consists of an axis portion 4a extending upwards from the surface of semiconductor substrate 1, a bottom surface portion 4b extending horizontally over silicon oxide film 3, and a perpendicular portion 4c provided along the periphery of bottom surface portion 4b and extending upwards. A cylinder is formed by horizontal portion 4b and perpendicular portion 4c. A BPSG (Boro-Phospho Silicate Glass) film 5 to which impurities such as boron and phosphorus are added is buried in the cylinder of lower electrode 4.

Referring to FIGS. 28 and 29, BPSG film 5 is removed by a gas phase hydrogen fluoride treatment so as to expose the inner surface of the cylinder of lower electrode 4.

Referring to FIG. 30, a dielectric film (ON film) 6 formed by silicon oxide film and silicon nitride film is deposited entirely on the surface of semiconductor substrate 1, and an upper electrode 7 of the capacitor formed by phosphorous doped polycrystalline silicon film is stacked on this ON film 6. Thus, the capacitor is completed.

Referring to FIG. 28, gas phase hydrogen fluoride treatment is performed when removing BPSG film 5 in the conventional manufacturing method of the semiconductor memory device. When removing BPSG film 5, hydrogen fluoride exhibits an extremely high selectivity as compared to silicon oxide film 3 which does not contain impurities. As a result, the amount of the etched BPSG film would be extremely large as compared to the amount of etched silicon oxide film 3, such that the inner surface of the cylinder of lower electrode 4 can be exposed without etching silicon oxide film 3.

FIGS. 31 to 33 are cross sectional views of a semiconductor device showing the respective steps performed in a method of manufacturing a semiconductor memory device according to a second conventional example, disclosed in Japanese Patent Laying-Open No. 2-219264.

Referring to FIG. 31, a gate oxide film 8 is formed on a semiconductor substrate 1, and on this gate oxide film 8 is formed a gate electrode 9. Gate electrode 9 is covered with an insulating film 10. A polycrystalline silicon pad 11 is formed on semiconductor substrate 1 so as to be in contact with an active region of semiconductor substrate 1. Thereafter, an interlayer insulating film 2, a silicon nitride film 12 and a BPSG film 5 are formed on semiconductor substrate 1. A contact hole is formed in BPSG film 5, silicon nitride film 12 and interlayer insulating film 2, penetrating these films to expose the surface of polycrystalline silicon pad 11. A lower electrode 4 connected to polycrystalline silicon pad 11 through the contact hole is formed. Lower electrode 4 consists of a cylindrical portion and a horizontal portion attached to the upper end of this cylindrical portion to extend horizontally.

Referring to FIGS. 31 and 32, BPSG film 5 is subjected to etching under a condition in which the etching ratio of BPSG film 5 is higher with respect to lower electrode 4. By this etching, BPSG film 5 is removed.

Referring to FIG. 33, lower electrode 4 is covered with a dielectric film 6. Thereafter, an upper electrode (opposite electrode) 7 is stacked on semiconductor substrate 1 so as to cover lower electrode 4 with dielectric film 6 therebetween. Thus, the capacitor is completed.

According to this method, the upper and lower surfaces of the horizontal portion of lower electrode 4 as well as the outer and inner sides of the cylindrical portion of lower electrode 4 also contribute to the capacitance of the capacitor, so that the effective capacitance of the capacitor can be increased.

The method of manufacturing a conventional semiconductor memory device is performed as described above, providing an approach to increase the capacitance of the capacitor. Considering the fact that the cell area tends to be made smaller as DRAMs are being integrated to a higher degree, there is a need to further increase the capacitance of the capacitor without enlarging the cell area of the memory cell.

However, referring to FIG. 32, since the horizontal portion of lower electrode 4 is separated from interlayer insulating film 2 in the second conventional technique, the strength of a connecting portion 4d for providing connection between the horizontal portion of lower electrode 4 and cylindrical portion of the capacitor buried in the contact hole would be degraded. Since the connecting portion is entirely formed of silicon filled with crystal grains, megasonic cleaning or the like would apply a force owing to vibration between the crystal grains such that lower electrode 4 would break at connecting portion 4d.

SUMMARY OF THE INVENTION

Based upon the foregoing, it is an object of the present invention to provide a semiconductor memory device which is improved so that the capacitance can be increased without increasing the cell area.

It is another object of the present invention to provide a semiconductor memory device having a cylindrical capacitor with a lower electrode which does not break.

It is still another object of the present invention to provide a method of manufacturing a semiconductor memory device in which the capacitance of a capacitor can be increased without increasing the cell area.

It is a further object of the present invention to prevent the break of a capacitor in a method of manufacturing a semiconductor memory device having a cylindrical capacitor.

A semiconductor memory device according to a first aspect of the present invention includes a semiconductor substrate. A source/drain region is formed at the main surface of this semiconductor substrate. An interlayer insulating film is formed on the semiconductor substrate. A contact hole is formed in the interlayer insulating film for exposing the surface of the source/drain region. To this source/drain region, a lower electrode of a capacitor is connected through the contact hole. This lower electrode includes an axis portion provided within the contact hole, extending upwards from the surface of the source/drain region. This axis portion extends upwards while being spaced apart from the inner wall surface of the contact hole. One end of the axis portion is in connection with the source/drain region, the other end of the axis portion extruding from the contact hole. The lower electrode further includes a horizontal portion which is connected to the other end of the axis portion and is extending horizontally. The inner wall surface of the contact hole, the outer surface of the axis portion of the capacitor and the outer surface of the horizontal portion of the capacitor including its upper and lower surfaces are covered with a capacitor insulating film. An upper electrode of the capacitor is provided on the semiconductor substrate so as to cover the outer surface of the axis portion of the capacitor and the outer surface of the horizontal portion of the capacitor with the capacitor insulating film therebetween.

A semiconductor memory device according to a second aspect of the present invention includes a semiconductor substrate. A source/drain region is formed at the main surface of the semiconductor substrate. An interlayer insulating film is provided on the semiconductor substrate. In the interlayer insulating film, a contact hole is provided to expose the surface of the source/drain region. A sidewall spacer having a cylindrical shape is provided such that it covers the inner surface of the contact hole, having its one end in contact with the source/drain region and its other end extruding above the contact hole. Through this contact hole, a lower electrode of a capacitor is connected to the source/drain region. This lower electrode includes an upward-extending axis portion buried inside the cylinder of the above-described cylinder-shaped sidewall spacer, having its one end in contact with the source/drain region and its other end extruding from the contact hole. The above-described lower electrode includes a horizontal portion in connection with the other end of the axis portion, extending horizontally. Moreover, in this device, a capacitor insulating film covers the outer surface of the horizontal portion including its upper and lower surfaces. An upper electrode of the capacitor is provided above the semiconductor substrate with the capacitor insulating film therebetween so as to cover the outer surface of the horizontal portion including its upper end lower surfaces.

According to a method of manufacturing a semiconductor memory device in accordance with a third aspect of the present invention, a semiconductor substrate is first prepared with a source/drain region formed on its surface. A non-doped silicon oxide film is formed on the semiconductor substrate. On the non-doped silicon oxide film, a first doped silicon oxide film including phosphorus is formed. A contact hole is formed in these first doped silicon oxide film and non-doped silicon oxide film, penetrating these films and exposing the surface of the source/drain region. A second doped silicon oxide film including phosphorus is formed on the semiconductor substrate to cover the inner side surface of the contact hole. This second doped silicon oxide film is subjected to anisotropical etching to expose the surface of the source/drain region so as to form a sidewall spacer formed by doped silicon oxide film having a cylindrical shape at the inner side surface of the contact hole. A first conductive film is formed on the semiconductor substrate, buried in the contact hole and extending horizontally. This first conductive film is patterned to form a lower electrode of a capacitor having an axis portion extending perpendicularly and a horizontal portion extending horizontally. By effecting a gas phase hydrogen fluoride treatment on the surface of the semiconductor substrate, the first doped silicon oxide film and the sidewall spacer formed by the doped silicon oxide film are removed, and thus the outer surface of the axis portion of the lower electrode and the lower surface of the horizontal portion of the lower electrode are exposed. The outer surface of the axis portion of the above-described lower electrode and the outer surface of the lower electrode including the lower surface of the lower electrode are covered with a capacitor insulating film. An upper electrode of the capacitor is formed above the semiconductor substrate to cover the outer surface of the axis portion of the lower electrode and the outer surface of the lower electrode including the lower surface of the horizontal portion of the lower electrode with the capacitor insulating film therebetween.

According to a method of manufacturing a semiconductor memory device in accordance with a fourth aspect of the present invention, a semiconductor substrate is first prepared having a source/drain region formed in its surface. A first non-doped silicon oxide film is formed on the semiconductor substrate. A doped silicon oxide film including phosphorus is formed on the first non-doped silicon oxide film. A contact hole is formed in the doped silicon oxide film and the first non-doped silicon oxide film, penetrating these films and exposing the surface of the source/drain region. A sidewall spacer of an amorphous material having a cylindrical shape is formed at the inner side surface of the contact hole. A first conductive film which buries the contact hole and extends horizontally is formed on the semiconductor substrate. This first conductive film is patterned to form a lower electrode of a capacitor having an axis portion extending perpendicularly and a horizontal portion extending horizontally. By effecting a gas phase hydrogen fluoride treatment on the surface of the semiconductor substrate, the doped silicon oxide film is removed and thus the lower surface of the horizontal portion of the lower electrode is exposed. The outer surface of the lower electrode including the lower surface of the horizontal portion of the lower electrode is covered with a capacitor insulating film. An upper electrode of the capacitor is formed above the semiconductor substrate so as to cover the outer surface of the lower electrode including a lower surface of the horizontal portion of the lower electrode with the capacitor insulating film therebetween.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in the following with reference to the figures.

[Embodiment 1]

Figure 1:
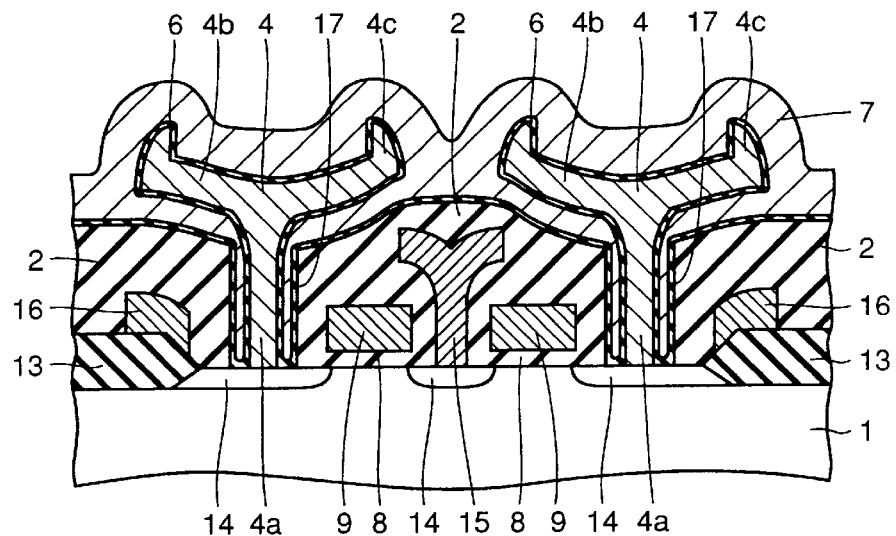
FIG. 1 is a cross sectional view of a semiconductor memory device according to Embodiment 1.
Figure 2:
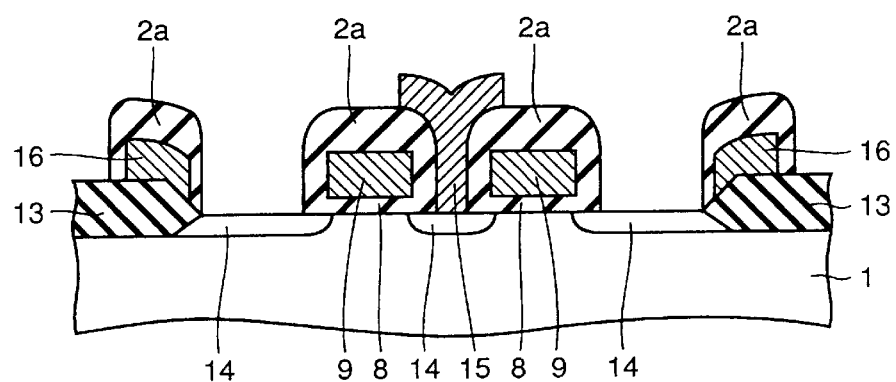
FIGS. 2 to 13 are cross sectional views of a semiconductor device showing the first to twelfth steps in the order of the steps performed in a method of manufacturing the semiconductor memory device according to Embodiment 1.

FIG. 1 is a cross sectional view of a semiconductor memory device according to Embodiment 1.

At a main surface of a semiconductor substrate 1, a field oxide film 13 is provided to isolate an active region from other active regions. A gate electrode 9 is provided on semiconductor substrate 1. Source/drain regions 14 are formed in the main surface of semiconductor substrate 1 at both sides of gate electrode 9. A bit line 15 is connected to one of source/drain regions 14. Covering gate electrodes 9 and 16, an interlayer insulating film 2 is provided on semiconductor substrate 1. A contact hole 17 is formed to expose the surface of the other one of source/drain regions 14. A lower electrode 4 of a capacitor is connected to the other source/drain region 14 through contact hole 17. Lower electrode 4 of the capacitor consists of an axis portion 4a, a horizontal portion 4b and a perpendicular portion 4c. Axis portion 4a extends upwards from the surface of the other source/drain region 14. Axis portion 4a extends upwards while being spaced apart from the inner wall surface of contact hole 17, having its one end connected to the other source/drain region 14 and its other end extruding from contact hole 17. Horizontal portion 4b which extends horizontally is in connection with the other end of axis portion 4a. Along the periphery of horizontal portion 4b, a perpendicular portion 4c extending upwards is provided. Inner surface of contact hole 17, the outer surface of axis portion 4a, the outer surface of horizontal portion 4b including its upper and lower surfaces, and the outer surface of perpendicular portion 4c are covered with a capacitor insulating film 6. An upper electrode 7 of the capacitor is provided above semiconductor substrate 1 with capacitor insulating film 6 therebetween so as to cover the outer surface of axis portion 4a, the outer surface of horizontal portion 4b and the outer surface of perpendicular portion 4c. When a semiconductor memory device is formed in this manner, the surface of axis portion 4a of lower electrode 4 of the capacitor can also be the surface of the electrode of the capacitor, and thus it is possible to increase its capacitance without increasing the cell area.

Next, a method of manufacturing the semiconductor memory device according to Embodiment 1 will be described.

Field oxide film 13 for isolating an active region from other active regions is formed at the main surface of semiconductor substrate 1 by thermal oxidation. Gate oxide film 8 is formed on semiconductor substrate 1. Thereafter, gate electrodes 9 and 16 of polycrystalline silicon are formed on semiconductor substrate 1. Ions of impurities such as phosphorus and boron are implanted into the surface of semiconductor substrate 1, and by performing thermal diffusion of the impurity ions, source/drain regions 14 are formed. An insulating layer (not shown) is stacked on semiconductor substrate 1 so as to cover gate electrodes 9 and 16. By performing an anisotropical etching to the insulating layer, an insulating layer 2a which covers gate electrodes 9 and 16 only is formed. Thereafter, a bit line 15 connected to one of source/drain regions 14 is formed on semiconductor substrate 1 by photolithography.

Figure 3:
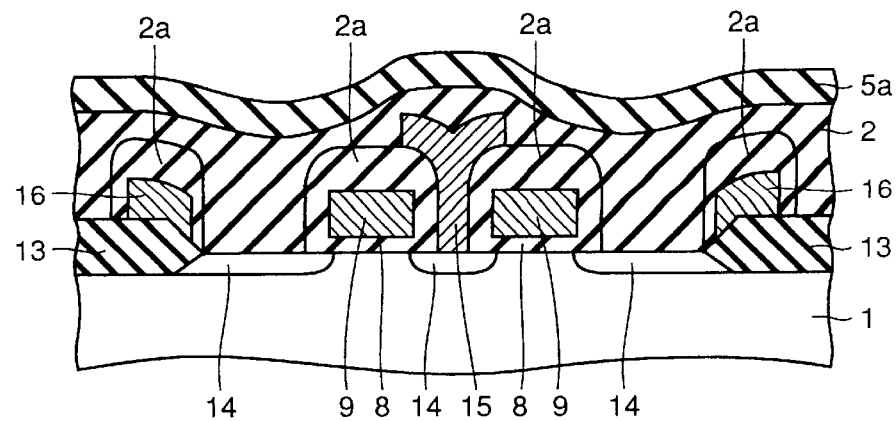

Referring to FIG. 3, interlayer insulating film 2 of non-doped silicon oxide film is formed on semiconductor substrate 1 to cover bit line 15. A BPTEOS (Boro-Phospho Tetraethyl Ortho Silicate) film 5a is formed on interlayer insulating film 2.

Figure 4:
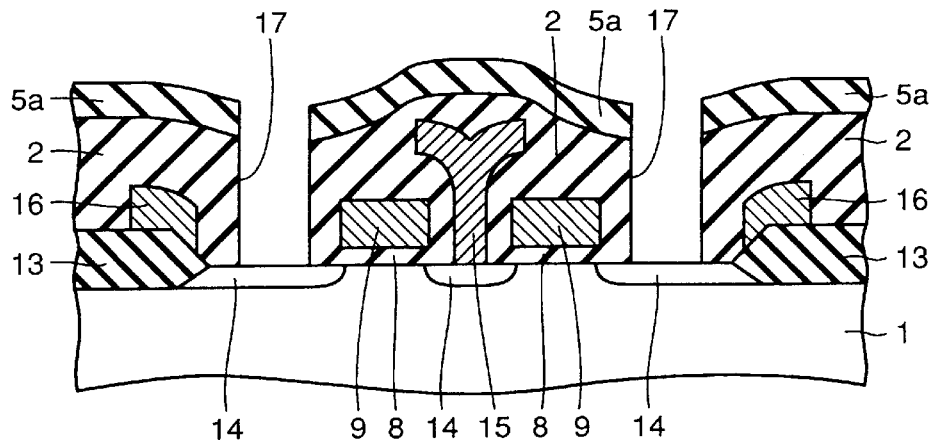

Referring to FIGS. 3 and 4, contact hole 17 is formed in interlayer insulating film 2 and BPTEOS film 5a, penetrating these films and exposing a surface of the other source/drain region 14. The diameter of the opening of contact hole 17 is preferably not larger than 3000 Å.

Figure 5:
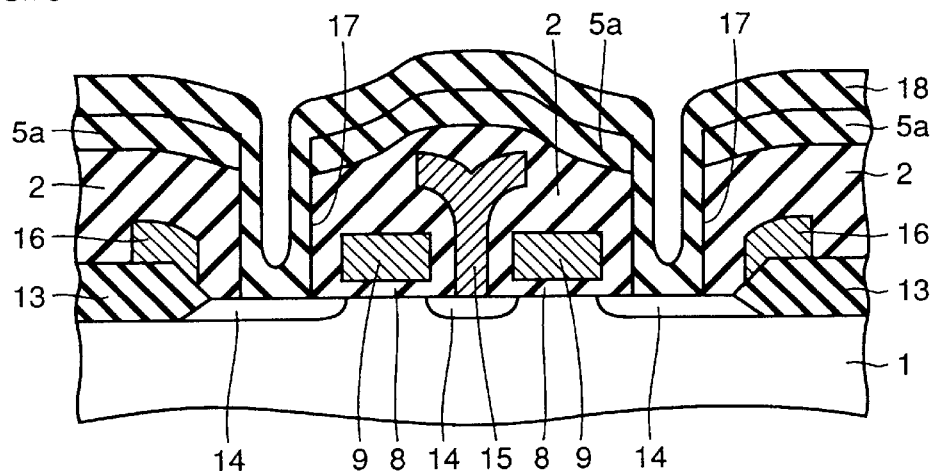

Referring to FIG. 5, a BPTEOS film 18 having a uniform thickness is formed on semiconductor substrate 1 so as to cover the inner side surface of contact hole 17.

Figure 6:
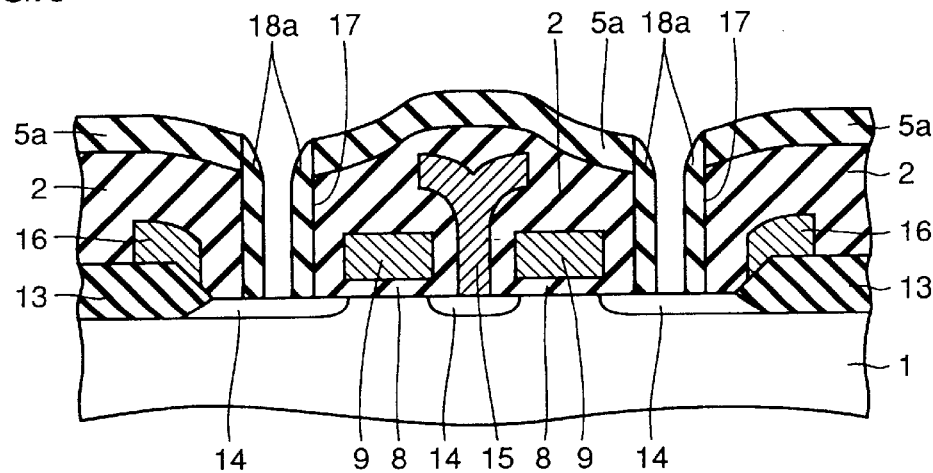

Referring to FIG. 6, by effecting anisotropical etching to BPTEOS film 18 to expose the other source/drain region 14, a sidewall spacer 18a made of doped silicon oxide film having a cylindrical shape is formed at the inner side surface of contact hole 17.

Figure 7:
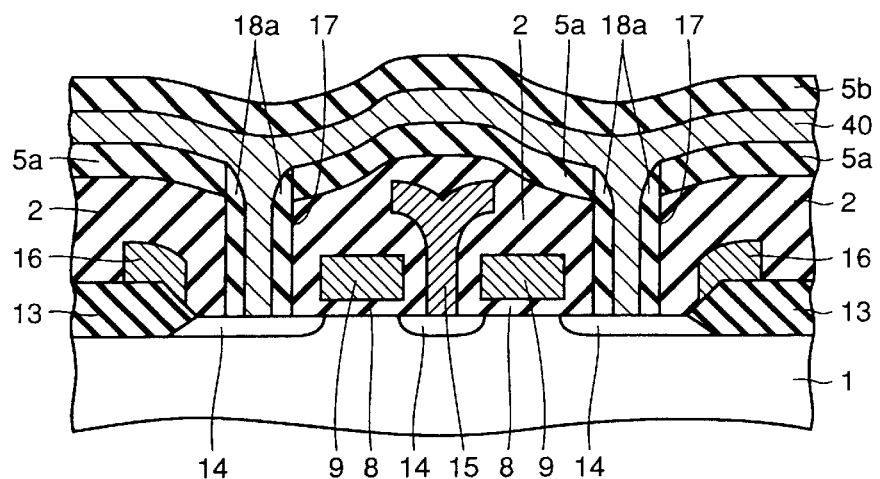

Referring to FIG. 7, a polycrystalline silicon film 40 containing impurity is formed on semiconductor substrate 1, to fill in contact hole 17 while extending horizontally. A BPTEOS film 5b is formed on polycrystalline silicon film 40.

Figure 8:
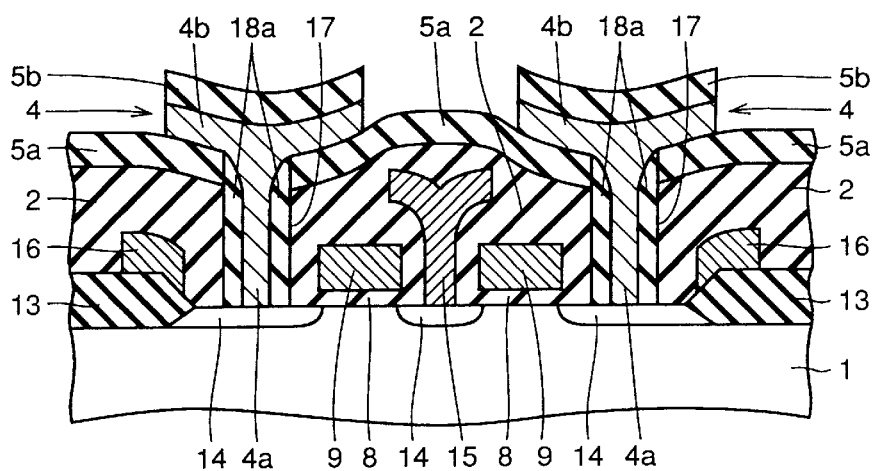

Referring to FIGS. 7 and 8, polycrystalline silicon film 40 and BPTEOS film 5b are patterned to form lower electrode 4 of the capacitor having axis portion 4a extending perpendicularly and horizontal portion 4b extending horizontally.

Figure 9:
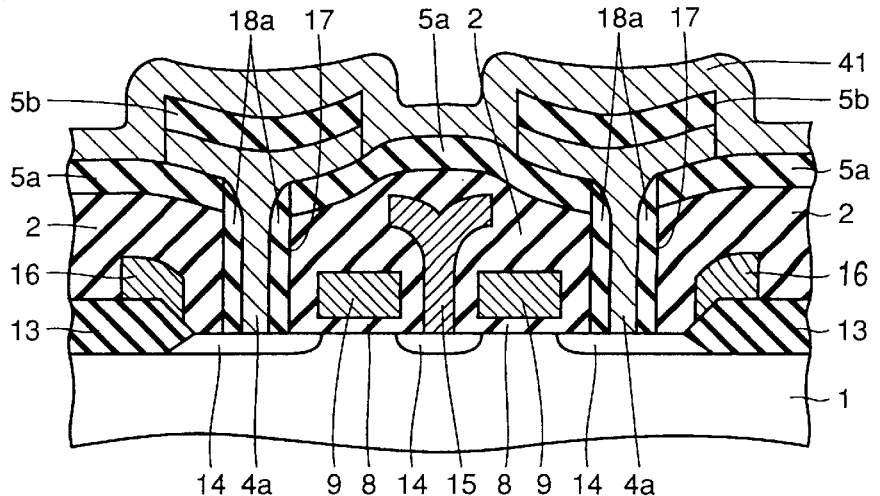

Referring to FIGS. 8 and 9, a polycrystalline silicon film 41 containing impurity is formed on semiconductor substrate 1 to be in connection with horizontal portion 4b of the lower electrode.

Figure 10:
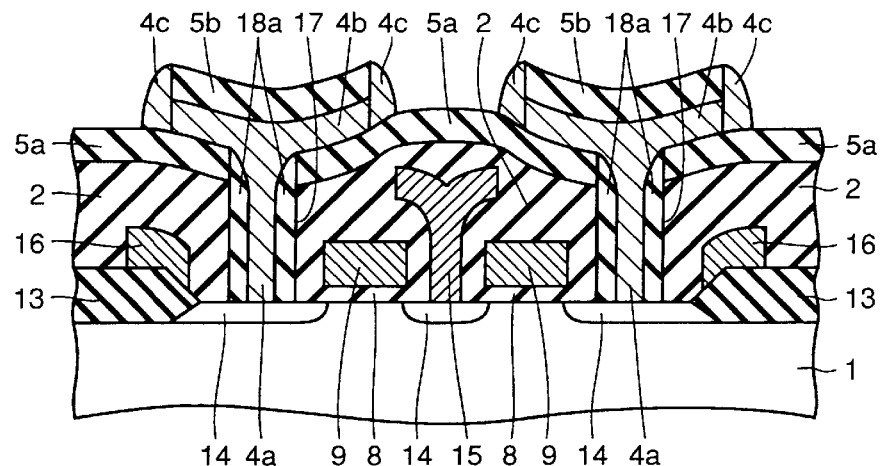

Referring to FIGS. 9 and 10, polycrystalline silicon film 41 is subjected to anisotropical etching using BPTEOS film 5a as an etching stopper, to form a perpendicular portion 4c extending upwards along the periphery of horizontal portion 4b, which is formed of conductor and is provided as a portion of the lower electrode.

Although reference characters 4a and 4b indicate polycrystalline films in this embodiment, they may be amorphous silicon films also.

Figure 11:
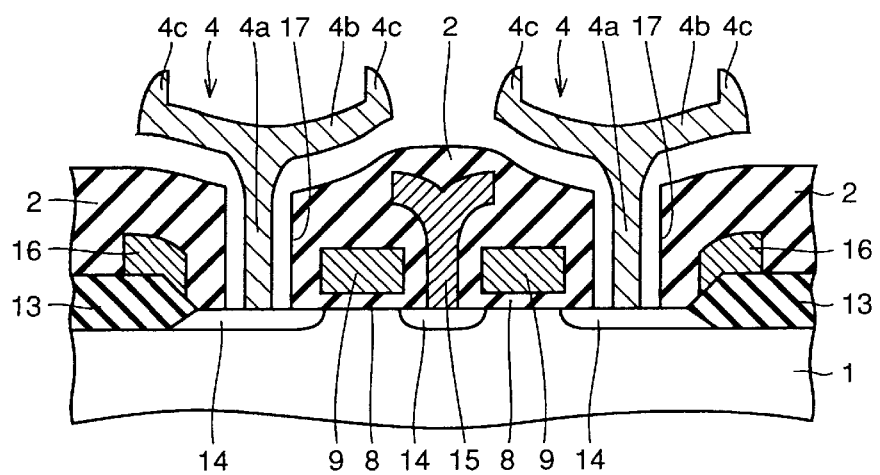

Referring to FIGS. 10 and 11, BPTEOS film 5b, BPTEOS film 5a, and sidewall spacer 18a of BPTEOS film existing within contact hole 17 are removed selectively by gas phase hydrogen fluoride treatment. By this gas phase hydrogen fluoride treatment, axis potion 4a of the lower electrode is formed spaced apart from the inner wall surface of contact hole 17. The condition for the gas phase hydrogen fluoride treatment is that it is performed at a nearly anhydrous state and that partial pressure of hydrogen fluoride is preferably several tens to several hundreds of Pa. Under this condition, selectivity of BPTEOS film with respect to TEOS film can be at least several tens or higher.

Figure 12:
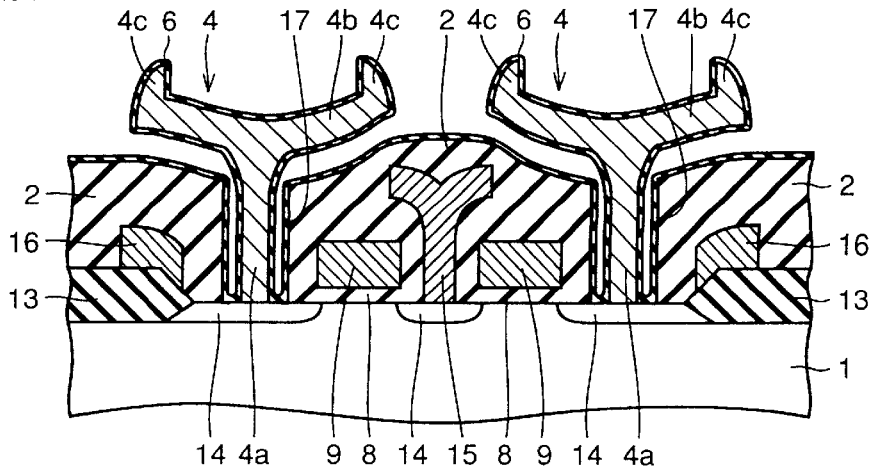

Referring to FIGS. 11 and 12, the outer surface of perpendicular portion 4a of lower electrode 4, the outer surface of horizontal portion 4b of the lower electrode including upper and lower surfaces of the horizontal portion 4b, and the outer surface of perpendicular portion 4c are covered with capacitor insulating film 6. Capacitor insulating film 6 is preferably formed from an ON film having a two-layered structure including oxide film and a nitride film. It is preferred that this ON film is formed so that the total thickness of the oxide film and the nitride film would be approximately 60 Å or smaller when converted into the thickness of the oxide film.

Figure 13:
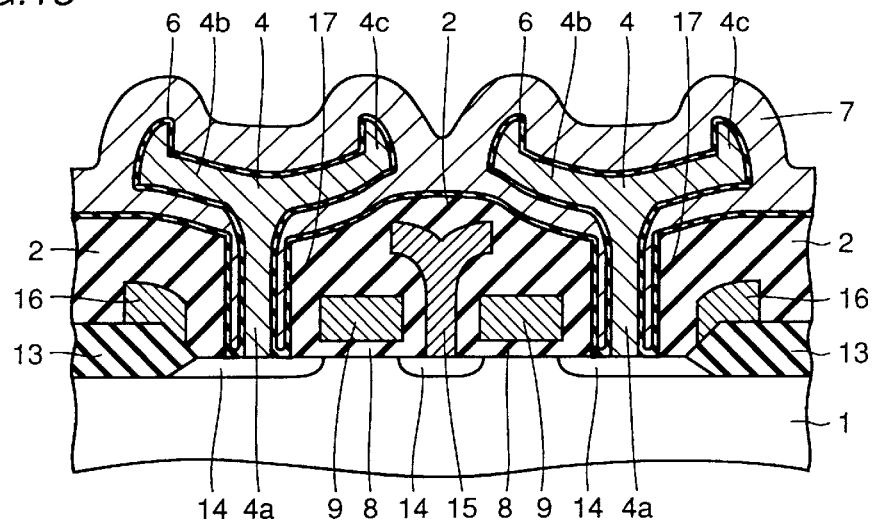

Referring to FIG. 13, by forming upper electrode 7 of the capacitor above semiconductor substrate 1 to cover the outer surface of perpendicular portion 4c of lower electrode 4 and the outer surface of horizontal portion 4b of lower electrode 4 including its lower and upper surfaces with capacitor insulating film 6 therebetween, the semiconductor memory device is completed.

According to this method, it is made possible to manufacture a semiconductor memory device in which the capacitance of the capacitor can be increased without increasing the cell area, and thus to obtain a semiconductor memory device having a higher performance.

Figure 14:
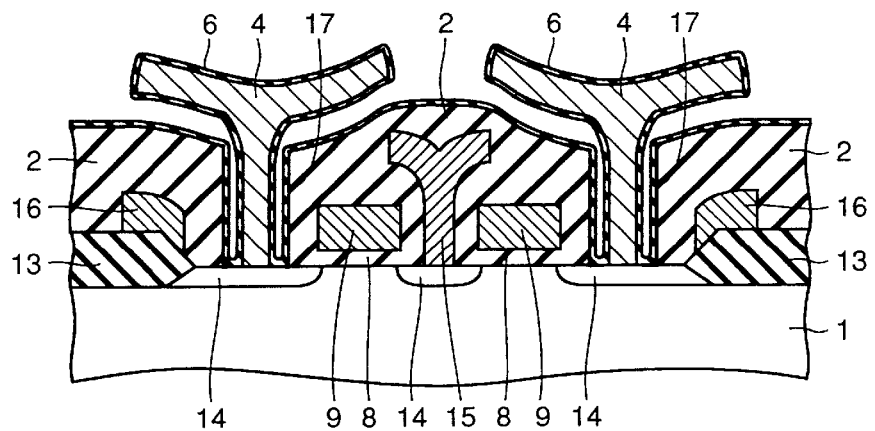
FIGS. 14 to 15 are cross sectional views of a semiconductor device showing the first and second steps in the order of the steps performed in the method of manufacturing a modified example of the semiconductor memory device according to Embodiment 1.
Figure 15:
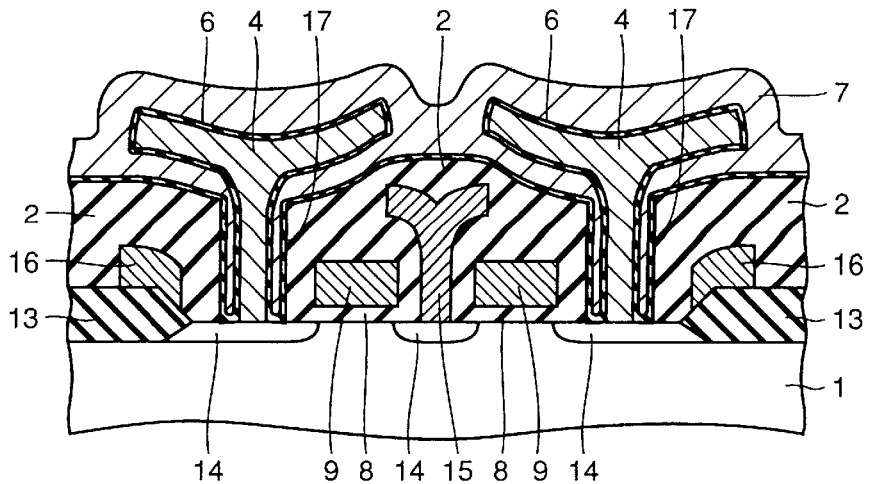

When there is a limitation on increasing the height of the semiconductor memory device, a manufacturing method shown in FIGS. 14 and 15 is preferred.

Description thereof will be given in the following.

First, process shown in FIGS. 2 to 8 is carried on. Thereafter, BPTEOS films 5a, 5b and sidewall spacer 18a are removed by gas phase hydrogen fluoride treatment. Then, referring to FIG. 14, the surface of lower electrode 4 of the capacitor is covered with capacitor insulating film 6.

Referring to FIG. 15, by forming an upper electrode 7 of the capacitor above semiconductor substrate 1 so as to cover the outer surface of lower electrode 4 of the capacitor with capacitor insulating film 6 therebetween, the capacitor is completed.

Although BPTEOS film was shown representatively as the substance which is etched away by gas phase hydrogen fluoride treatment in the above-described embodiment, the present invention is not limited thereto. Any insulating film containing at least phosphorus as the impurity can be employed.

[Embodiment 2]

Figure 16:
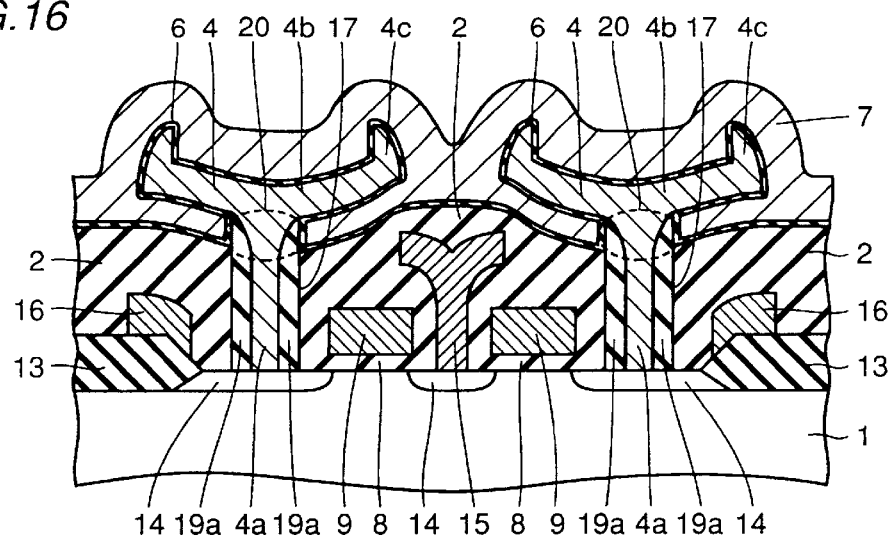
FIG. 16 is a cross sectional view of a semiconductor memory device according to Embodiment 2.

FIG. 16 is a cross sectional view of a semiconductor memory device according to Embodiment 2.

Referring to FIG. 16, a field oxide film 13 for isolating an active region from other active regions is formed at a main surface of a semiconductor substrate 1. A gate insulating film 8 is formed on semiconductor substrate 1. On semiconductor substrate 1, gate electrodes 9 and 16 are formed. Source/drain regions 14 are formed in the surface of semiconductor substrate 1 at both sides of gate electrode 9. A bit line 15 is connected to one of source/drain regions 14. An interlayer insulating film 2 is formed on semiconductor substrate 1 to cover bit line 15. A contact hole 17 is provided in interlayer insulating film 2 to expose the surface of the other source/drain region 14. A sidewall spacer 19a having a cylindrical shape covers the inner side surface of contact hole 17. Sidewall spacer 19a is of an amorphous material such as silicon oxide film. One end of sidewall spacer 19a is in contact with the other source/drain region 14 while the other end extrudes above contact hole 17. To the other source/drain region 14, a lower electrode 4 of the capacitor is connected through contact hole 17. Lower electrode 4 of the capacitor includes an upward-extending axis portion 4a which is buried within the cylinder of the cylinder-shaped sidewall spacer 19a and has its one end in connection with the other source/drain region 14 and the other end extruding from contact hole 17. Lower electrode 4 of the capacitor includes a horizontal portion 4b which is connected to the other end of axis portion 4a and is extending horizontally. Lower electrode 4 of the capacitor further includes a perpendicular portion 4c provided along the periphery of horizontal portion 4b, extending upwards.

In this specification, the horizontal portion and the perpendicular portion altogether may hereinafter be occasionally referred to as a cylindrical portion. The outer surface of horizontal portion 4b and perpendicular portion 4c of lower electrode of the capacitor is covered with capacitor insulating film 6. An upper electrode 7 of the capacitor is provided on semiconductor substrate 1 to cover the outer surface of horizontal portion 4b and perpendicular portion 4c of lower electrode 4 with capacitor insulating film 6 therebetween.

When the connecting portion between the cylindrical portion and the axis portion is entirely formed of silicon consisting of gathered crystal grains, the joint portion of the cylindrical portion and the axis portion could break by a small force applied between the crystal grains owing to megasonic cleaning or the like. However, since the surface of axis portion 4a is covered with amorphous non-doped silicon oxide film (that is, sidewall spacer 19a) in this embodiment, the strength of the joint portion between the cylindrical portion and the axis portion is made higher.

Figure 17:
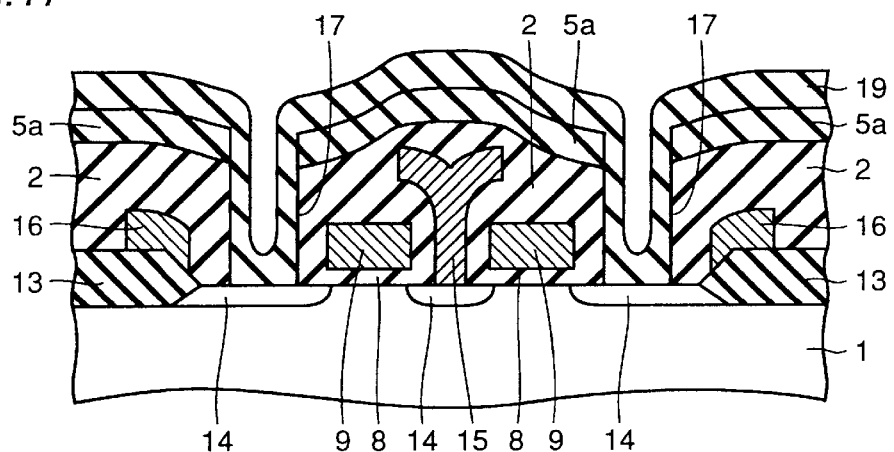
FIGS. 17 to 24 are cross sectional views of a semiconductor device showing the first to eighth steps in the order of the steps performed in the method of manufacturing the semiconductor memory device according to Embodiment 2.

A method of manufacturing the semiconductor memory device according to Embodiment 2 will now be described in the following. Referring to FIG. 17, field oxide film 13 for isolating an active region from other active regions is formed in the main surface of semiconductor substrate 1. Gate oxide film 8 is formed on semiconductor substrate 1. Gate electrodes 9 and 16 are formed on semiconductor substrate 1. Source/drain regions 14 are formed in the surface of semiconductor substrate 1 at both sides of gate electrode 9. Bit line 15 connected to one of source/drain regions 14 is formed. Covering bit line 15, interlayer insulating film 2 consisting of non-doped silicon oxide film is formed on semiconductor substrate 1. BPTEOS film 5a is formed on interlayer insulating film 2. Contact hole 17 is formed in BPTEOS film 5a and interlayer insulating film 2, penetrating these films and exposing the surface of the other source/drain region 14. Non-doped silicon oxide film 19 having a uniform thickness is formed on semiconductor substrate 1 so as to cover the inner side surface of contact hole 17.

Figure 18:
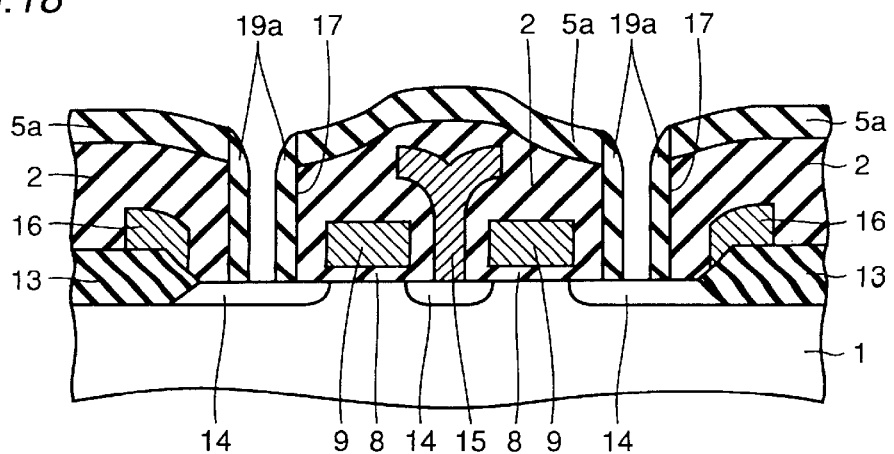

Referring to FIGS. 17 and 18, non-doped silicon oxide film 19 is subjected to anisotropical etching to expose the surface of the other source/drain region 14 thereby forming a sidewall spacer 19a formed by non-doped silicon oxide film having a cylindrical shape at the inner side surface of contact hole 17.

Figure 19:
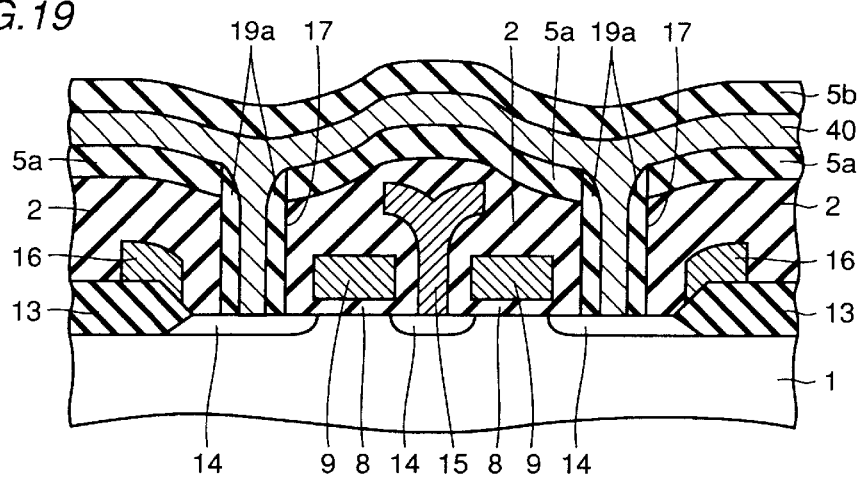

Referring to FIG. 19, a phosphorous doped polycrystalline silicon film 40 which buries contact hole 17 and is provided as a portion of the lower electrode of the capacitor extending horizontally is formed on semiconductor substrate 1. A BPTEOS film 5b having a constant thickness is formed on phosphorous doped polycrystalline silicon film 40.

Figure 20:
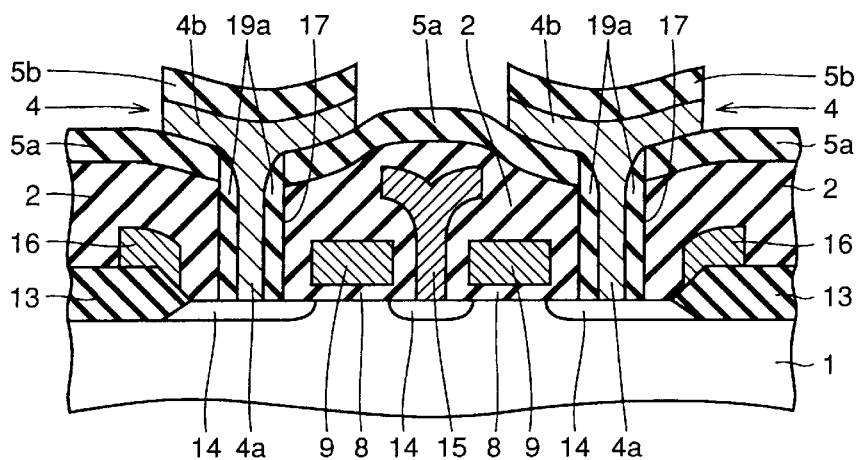

Referring to FIGS. 19 and 20, phosphorous doped polycrystalline silicon film 40 and BPTEOS film 5b are patterned to obtain a prescribed shape, thereby forming lower electrode 4 of the capacitor having axis portion 4a extending perpendicularly and horizontal portion 4b extending horizontally.

Figure 21:
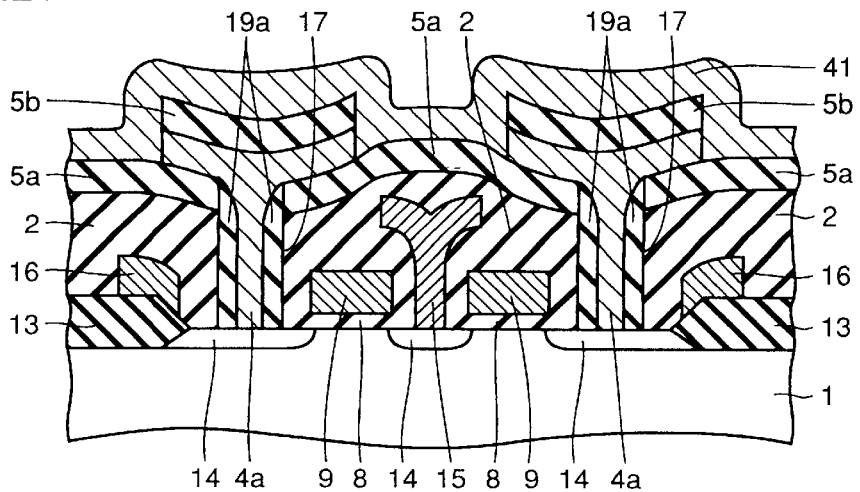

Referring to FIG. 21, a phosphorous doped polycrystalline silicon film 41 is formed on semiconductor substrate 1 so as to cover lower electrode 4 of the capacitor.

Figure 22:
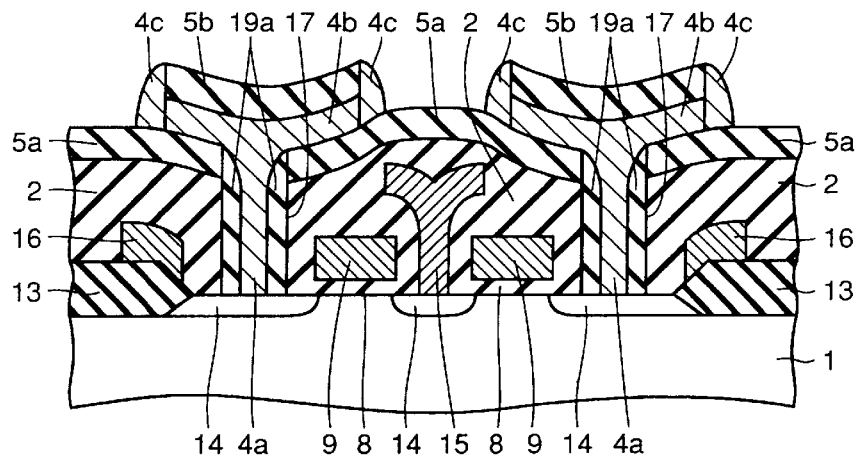

Referring to FIGS. 21 and 22, anisotropical etching is performed on phosphorous doped polycrystalline silicon film 41 to form perpendicular portion 4c extending upwards along the periphery of horizontal portion 4b, which is connected electrically to the horizontal portion 4b.

Figure 23:
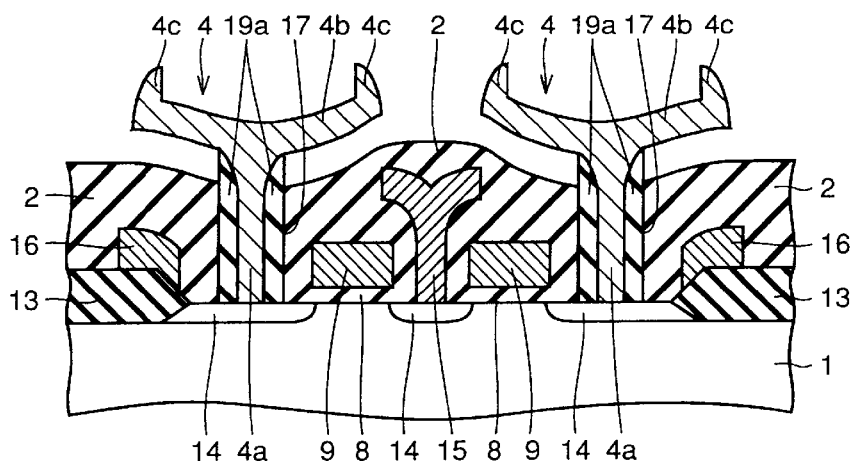

Referring to FIGS. 22 and 23, BPTEOS film 5b and BPTEOS film 5a formed on interlayer insulating film 2 are etched away by gas phase hydrogen fluoride treatment to expose the upper and lower surfaces of the horizontal portion 4b. At this time, sidewall spacer 19a is not removed by this gas phase hydrogen fluoride treatment since it is formed of non-doped silicon oxide film.

The connecting portion between axis portion 4a and horizontal portion 4b of lower electrode 4 is made relatively thin, but it is reinforced by sidewall spacer 19a formed of amorphous material so that it would not break even when a force is applied to this portion due to megasonic cleaning or the like.

Figure 24:
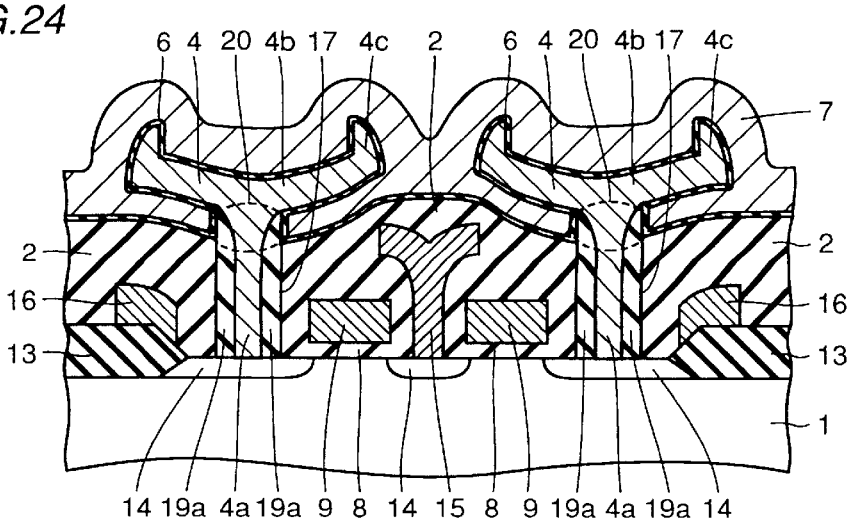

Referring to FIG. 24, the outer surface of horizontal portion 4b of its lower electrode including its lower surface is covered by capacitor insulating film 6. By forming upper electrode 7 of the capacitor above semiconductor substrate 1 to cover the outer surface of horizontal portion 4b of lower electrode 4 including its lower surface with capacitor insulating film 6 therebetween, formation of the capacitor is completed.

Figure 25:
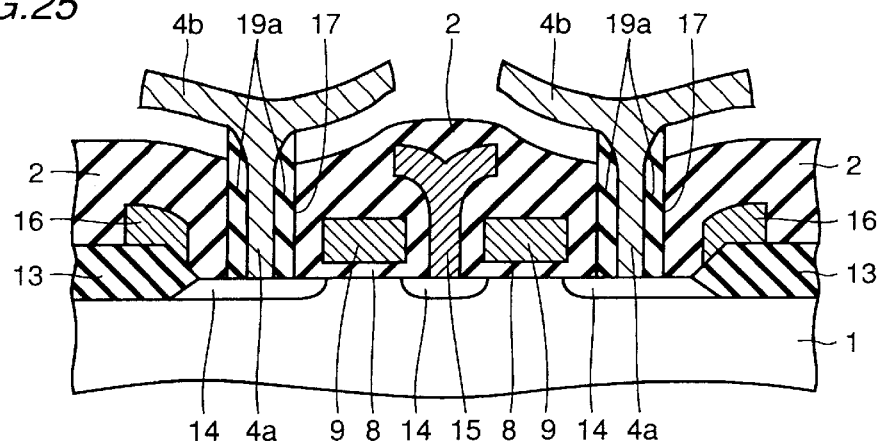
FIGS. 25 to 27 are cross sectional views of a semiconductor device showing the first to third steps in the order of the steps performed in the method of manufacturing a modified example of the semiconductor memory device according to Embodiment 2.
Figure 26:
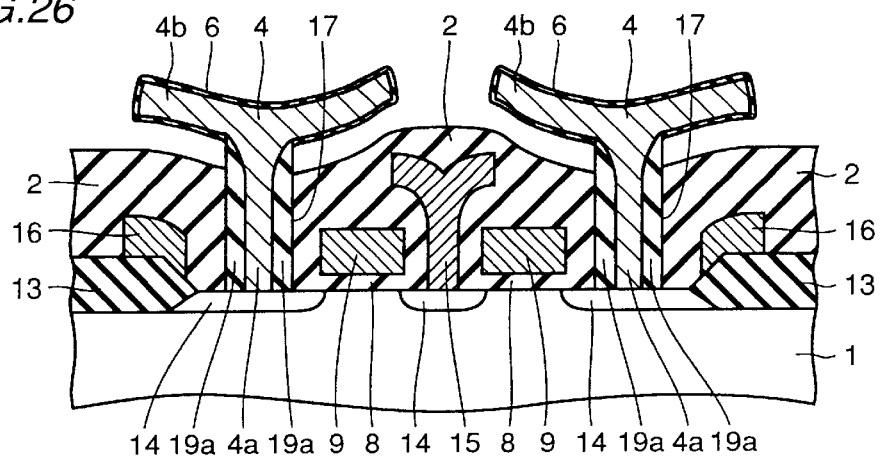

If there is a limitation on the height of the semiconductor memory device in this embodiment also, a method shown in FIGS. 25 and 26 would be adopted. Description thereof will be given in the following.

First, a process identical to the process shown in FIGS. 17 to 20 is carried on.

Referring to FIGS. 20 and 25, BPTEOS film 5a and BPTEOS film 5b are removed by gas phase hydrogen fluoride treatment to expose upper and lower surfaces of horizontal portion 4b of the lower electrode.

Referring to FIG. 26, the surface of the lower electrode 4 is covered with capacitor insulating film 6.

Figure 27:
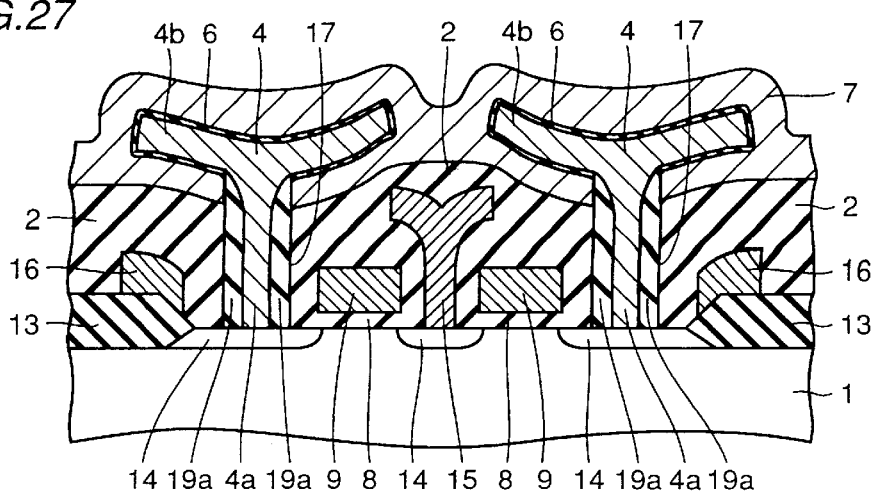
Figure 28:
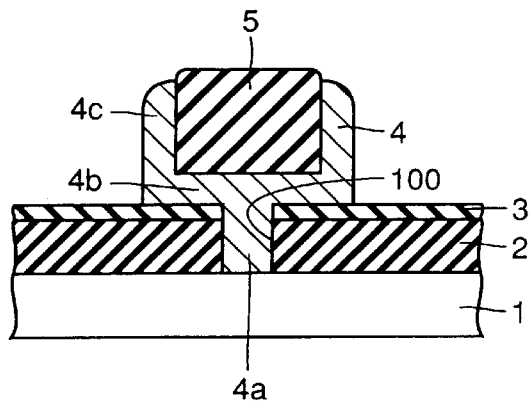
FIGS. 28 to 30 are cross sectional views of a semiconductor device showing the first to third steps in the order of the steps performed in the method of manufacturing a semiconductor memory device according to a first conventional example.
Figure 29:
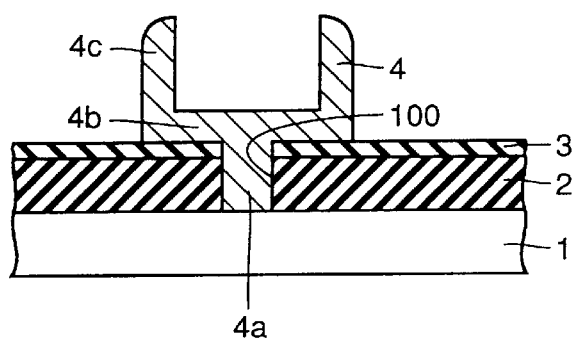
Figure 30:
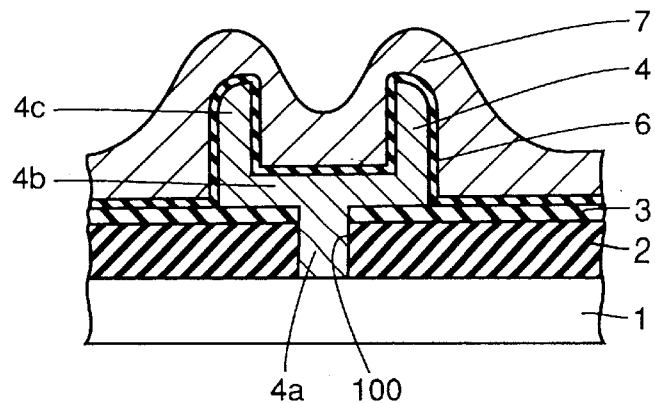
Figure 31:
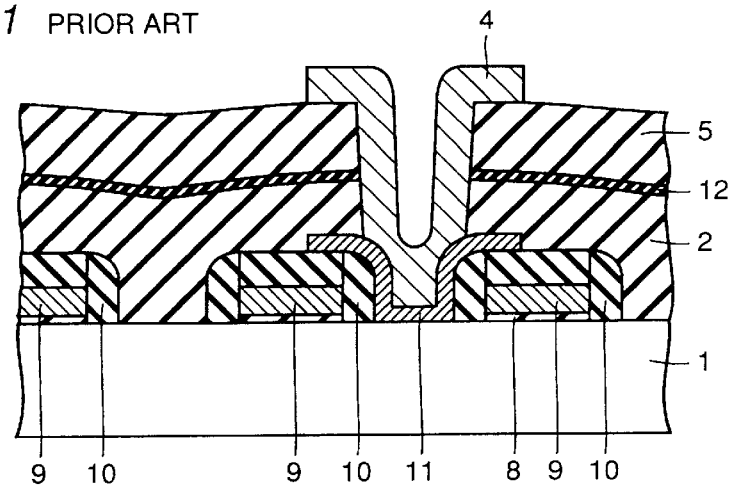
FIGS. 31 to 33 are cross sectional views showing the first to third steps in the order of the steps performed in the method of manufacturing a semiconductor memory device according to a second conventional example.
Figure 32:
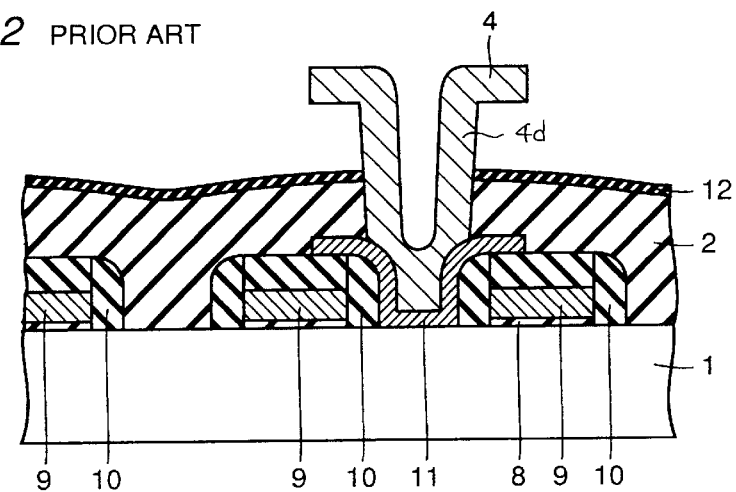
Figure 33:
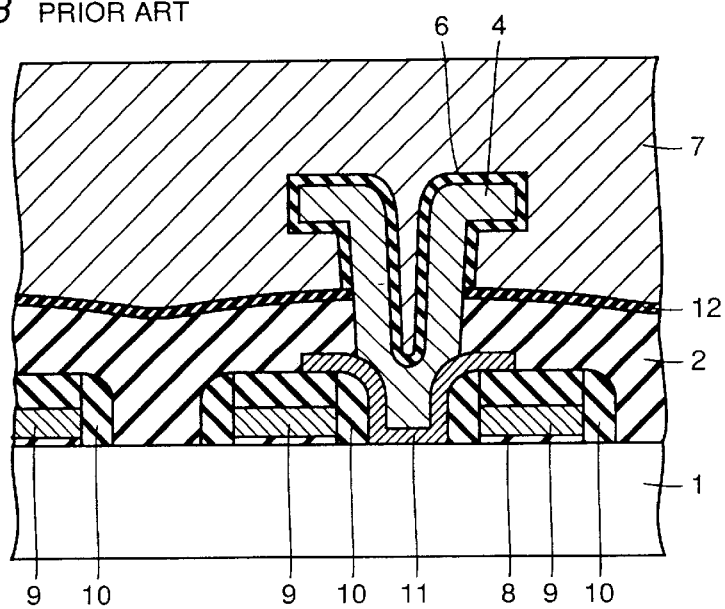

Referring to FIG. 27, by forming an upper electrode 7 of the capacitor above semiconductor substrate 1 to cover the surface of the lower electrode 4 with capacitor insulating film 6 therebetween, formation of the capacitor is completed.

In the above-described embodiment, an example has been shown in which sidewall spacer 19a surrounding axis portion 4a of lower electrode 4 of the capacitor is formed by a silicon oxide film containing no impurity, but the present invention is not limited thereto. Any amorphous substance may be employed as a sidewall spacer regardless of whether it is conductive or insulative as long as it has a resistivity to etching by gas phase hydrogen fluoride treatment to the same extent as that of BPTEOS film or to an extent higher than that of BPTEOS film.

Based on the foregoing, according to a semiconductor memory device in accordance with a first aspect of the present invention, the surface of an axis portion of a lower electrode of the capacitor can also be utilized as a surface of the electrode of a capacitor so that the capacitance can be increased without increasing the cell area.

According to a semiconductor memory device in accordance with a second aspect of the present invention, an axis portion of a lower electrode of the capacitor has its surface covered with a sidewall spacer such that strength of a connecting portion between the cylindrical portion and the axis portion is made higher.

According to a method of manufacturing a semiconductor memory device in accordance with a third aspect of the present invention, it is made possible to manufacture a semiconductor memory device in which capacitance of a capacitor can be increased without increasing the cell area and thus it is made possible to obtain a semiconductor memory device having a higher performance.

According to a method of manufacturing a semiconductor memory device in accordance with a fourth aspect of the present invention, an axis portion of a lower electrode of a capacitor has its surface covered with a sidewall spacer formed of amorphous material, and thus there would be an effect in which the semiconductor memory device with an improved strength of the connecting portion between the cylindrical portion and the axis portion would be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate;

a source/drain region formed at a main surface of said semiconductor substrate;

an interlayer insulating film formed on said semiconductor substrate;

a contact hole formed in said interlayer insulating film and having an inner wall surface extending straight from a top surface of said interlayer insulating film to a surface of said source/drain region, for exposing a surface of said source/drain region;

a lower electrode of a capacitor, connected to said source/drain region through said contact hole, said lower electrode including an axis portion in said contact hole, extending upward parallel to an inner wall surface of said contact hole, said axis portion having an inner wall surface spaced from said inner wall surface of said contact hole by a constant distance, said axis portion having one end connected to said source/drain region and the other end protruding from said contact hole, and a horizontal portion informed integral to said other end of said axis portion and extending horizontally parallel to said top surface of said insulating film such that any portion of a lower surface of said horizontal portion is spaced apart from said top surface of said interlayer insulating film by a constant distance;

a capacitor insulating film continuously covering an inner wall surface of said contact hole, a surface of said axis portion of said lower electrode of the capacitor and a lower surface of said horizontal portion of said lower electrode of the capacitor including its upper and lower surfaces; and an upper electrode of the capacitor, provided above said semiconductor substrate to continuously cover the surface of said axis portion of said lower electrode of the capacitor and the surface of said horizontal portion of said lower electrode of the capacitor with said capacitor insulating film therebetween, wherein the capacitor insulating film is in direct contact with the inner wall surface of said contact hole.

2. The semiconductor memory device according to claim 1, wherein said lower electrode of said capacitor further includes a perpendicular portion provided along the periphery of said horizontal portion and extending upwards, and said capacitor insulating film and said upper electrode also cover an outer surface of said perpendicular portion.

3. A semiconductor memory device comprising:

a semiconductor substrate;

a source/drain region formed at a main surface of said semiconductor substrate;

an interlayer insulating film formed on said semiconductor substrate;

a contact hole formed in said interlayer insulating film and having an inner wall surface extending straight from a top surface of said interlayer insulating film to a surface of said source/drain region, for exposing a surface of said source/drain region;

a cylindrical sidewall spacer covering directly said inner wall surface of said contact hole and having one end in contact with said source/drain region and the other end topping said contact hole;

a lower electrode of a capacitor, connected to said source/drain region through said contact hole, said lower electrode including an axis portion buried in the cylinder of said cylinder-shaped sidewall spacer, extending upwards to have its one end in contact with said source/drain region and its other end protruding from said contact hole, and a horizontal portion formed integral to said other end of said axis portion and extending horizontally parallel to the top surface of said insulating film such that any portion of a lower surface of said horizontal portion is spaced apart from a top surface of said interlayer insulating film by a constant distance;

a capacitor insulating film covering an outer surface of said horizontal portion including its upper and lower surfaces and said other end of the cylindrical sidewall spacer protruding above said contact hole; and an upper electrode of the capacitor provided above said semiconductor substrate to cover the outer surface of said horizontal portion including its upper and lower surfaces with said capacitor insulating film therebetween.

4. The semiconductor memory device according to claim 3, wherein said lower electrode of said capacitor further includes a perpendicular portion provided along the periphery of said horizontal portion and extending upwards, and said capacitor insulating film and said upper electrode also cover an outer surface of the perpendicular portion.

5. The semiconductor memory device according to claim 3, wherein said sidewall spacer is formed of an amorphous material.

6. The semiconductor memory device according to claim 5, wherein said sidewall spacer is formed by non-doped silicon oxide film.

7. The semiconductor memory device according to claim 1, wherein said upper electrode of the capacitor is made up of mono-layer.

8. The semiconductor memory device according to claim 1, wherein said capacitor insulating film is formed from an ON film having a two-layered structure including an oxide film and a nitride film.

9. The semiconductor memory device according to claim 8, said ON film is formed so that the total thickness of the oxide film and the nitride film is approximately 60 Å or smaller when converted into the thickness of the oxide film.

10. The semiconductor memory device according to claim 3, wherein said sidewall spacer is made up by silicon oxide film only.

11. The semiconductor memory device according to claim 3, wherein said capacitor insulating film is formed from an ON oxide film having two-layered structure including an oxide film and a nitride film.

12. The semiconductor memory device according to claim 11, wherein said ON film is formed so that the total thickness of the oxide film and the nitride film is approximately 60 Å or smaller when converted into the thickness of the oxide film.

* * * * *

UNITED STATES PATENT AND TRADEMARK OFFICE
CERTIFICATE OF CORRECTION

PATENT NO. : 5,986,300
DATED : November 16, 1999
INVENTOR(S) : Yoshinori TANAKA

It is certified that error appears in the above-identified patent and that said Letter Patent is hereby corrected as shown below:

On the Title page:

Section [30], Foreign Application Priority Data, change the filing date from "June 27, 1996" to --June 27, 1995--.

In the Claims:

Column 10, Claim 1, Line 60, change "informed" to --formed--.

Signed and Sealed this

Fifteenth Day of May, 2001

*Attest:*

NICHOLAS P. GODICI

*Attesting Officer*  *Acting Director of the United States Patent and Trademark Office*